United States Patent
Chen et al.

(10) Patent No.: US 8,744,018 B2
(45) Date of Patent: Jun. 3, 2014

(54) EARLY TERMINATION SCHEMES FOR TURBO DECODING IN A WIRELESS COMMUNICATION SYSTEM

(75) Inventors: Jinghu Chen, San Diego, CA (US); Wanlun Zhao, San Diego, CA (US); Mingxi Fan, San Diego, CA (US); Fuyun Ling, San Diego, CA (US); Peter John Black, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 90 days.

(21) Appl. No.: 13/440,287

(22) Filed: Apr. 5, 2012

(65) Prior Publication Data

US 2013/0266097 A1 Oct. 10, 2013

(51) Int. Cl.
*H04L 27/06* (2006.01)

(52) U.S. Cl.
USPC ........... 375/341; 375/262; 375/265; 375/316; 714/746; 714/752; 714/755; 714/774; 714/794; 714/795

(58) Field of Classification Search
USPC .......... 375/262, 265, 316, 341; 714/746, 752, 714/755, 774, 794, 795
See application file for complete search history.

(56) References Cited

U.S. PATENT DOCUMENTS

| | | |
|---|---|---|
| 6,182,261 B1 | 1/2001 | Haller et al. |
| 6,888,901 B2 | 5/2005 | Yu et al. |
| 7,249,304 B2 | 7/2007 | Yu et al. |
| 7,454,684 B2 | 11/2008 | Allpress |
| 7,657,819 B2 | 2/2010 | Berkmann et al. |
| 2003/0023920 A1 | 1/2003 | Jeong et al. |
| 2004/0260995 A1 | 12/2004 | Allpress |
| 2009/0049358 A1 | 2/2009 | Jalloul et al. |
| 2011/0246850 A1 | 10/2011 | Rault et al. |

FOREIGN PATENT DOCUMENTS

EP 1455457 A1 9/2004

OTHER PUBLICATIONS

International Search Report and Written Opinion—PCT/US2013/035336—ISA/EPO—May 6, 2013.
Matache, et al., "Stopping Rules for Turbo Decoders," JPL Technical Report, Aug. 2000, pp. 1-22.
Rose Y. Shao., et al., "Two Simple Stopping Criteria for Turbo Decoding" IEEE Transactions on Communications, IEEE Service Center, Piscataway, NJ, US, vol. 47, No. 8, Aug. 1, 1999, XP011009477 ISSN: 0090-6778 abstract, pp. 1117-1120.

*Primary Examiner* — Leon Flores
(74) *Attorney, Agent, or Firm* — Kristine U. Ekwueme

(57) ABSTRACT

Certain embodiments provide methods that may allow for improvements in performance and power consumption by terminating the turbo decoding process early when one of at least two test criterion is satisfied in communications systems, including UMTS, WCDMA, and TD-DCMA.

20 Claims, 10 Drawing Sheets

EARLY TERMINATION SCHEMES FOR TURBO DECODING IN A WIRELESS COMMUNICATION SYSTEM

BACKGROUND

1. Field

Certain aspects of the present disclosure generally relate to wireless communications and, more particularly, to methods of enforcing early termination of decoding by a receiver in a wireless system.

2. Background

Wireless communication systems are widely deployed to provide various types of communication content such as voice, video, packet data, messaging, broadcast, etc. These systems may be multiple-access systems capable of supporting communication with multiple users by sharing the available system resources (e.g., bandwidth and transmit power). Examples of such multiple-access systems include Universal Mobile Telecommunication Systems (UMTS), Wideband Code Division Multiple Access (WCDMA), and Time Division Code Division Multiple Access (TD-CDMA).

Generally, a wireless communication system comprises mobile stations and base stations that can send and receive transmissions containing the various types of communication content mentioned above. Such transmissions are typically sent between a transmitter and a receiver. To efficiently transmit and receive information, signals are usually encoded into a special format before transmission and decoded by a receiver after reception.

Numerous encoding and decoding methods exist, with each presenting advantages and challenges, as well.

SUMMARY

Certain aspects of the present disclosure generally relate to wireless communication systems and, more specifically, to methods of enforcing early termination of decoding by a receiver in a wireless communication system. For certain aspects, the early termination during turbo decoding (TDEC) may be implemented in communications systems, such as UMTS, WCDMA, and TD-CDMA.

In an aspect of the disclosure, a method for wireless communications is provided. The method generally includes initiating a decoding procedure to decode a received signal in a wireless system, evaluating at least two criteria, and terminating the decoding procedure early if at least one the at least two criteria is satisfied.

In an aspect of the disclosure, an apparatus for wireless communications is provided. The apparatus generally includes means for initiating a decoding procedure to decode a received signal in a wireless system, means for evaluating at least two criteria, and means for terminating the decoding procedure early if at least one the at least two criteria is satisfied.

In an aspect of the disclosure, an apparatus for wireless communications is provided. The apparatus generally includes at least one processor configured to initiate a decoding procedure to decode a received signal in a wireless system, evaluate at least two criteria, and terminate the decoding procedure early if at least one the at least two criteria is satisfied; and a memory coupled with the at least one processor.

In an aspect of the disclosure, a computer program product comprising instructions stored thereon is provided. The instructions are generally executable by one or more processors for initiating a decoding procedure to decode a received signal in a wireless system, evaluating at least two criteria, and terminating the decoding procedure early if at least one the at least two criteria is satisfied.

BRIEF DESCRIPTION OF THE DRAWINGS

Aspects and embodiments of the disclosure will become more apparent from the detailed description set forth below when taken in conjunction with the drawings in which like reference characters identify correspondingly throughout.

DETAILED DESCRIPTION

Figure 1:
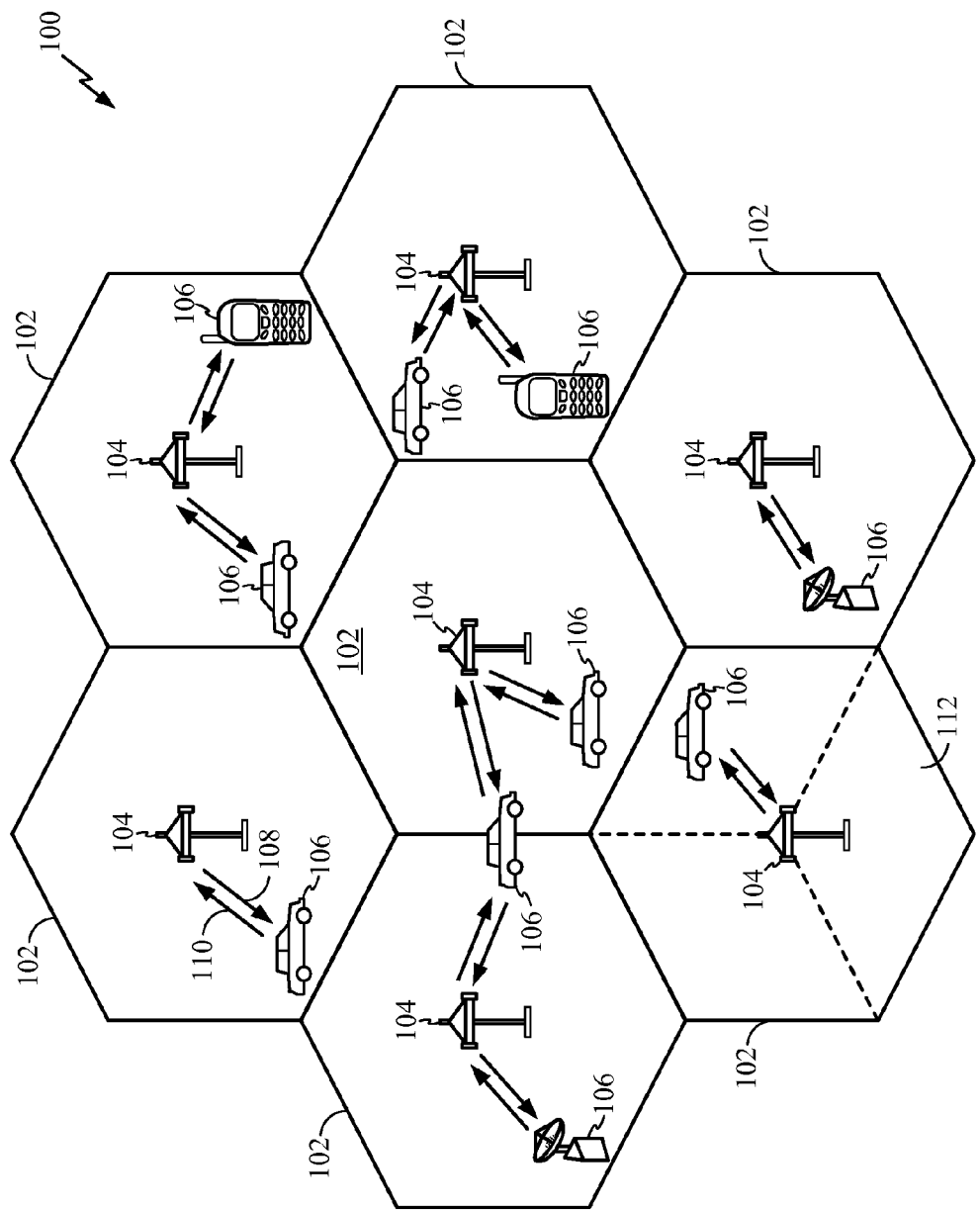
FIG. 1 illustrates an example wireless communication system, in accordance with certain embodiments of the present disclosure.

In various wireless systems, including WCDMA and TD-SCDMA, cyclic redundancy check (CRC) values are not appended to every code block. As a result, on the receiver side, a decoder may not be able to base early termination decisions on CRC checks.

Certain aspects of the present disclosure, however, allow for early termination based on various criteria, that may result in fewer than a full number of iterations and, therefore, avoid needless power consumption in scenarios where the criteria indicates that the likelihood of successful decoding is low, or that correct decoding is already reached.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

An Example Telecommunications System

The techniques described herein may be used for various broadband wireless communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

One specific example of a communication system based on an orthogonal multiplexing scheme is a WiMAX system. WiMAX, which stands for the Worldwide Interoperability for Microwave Access, is a standards-based broadband wireless technology that provides high-throughput broadband connections over long distances. There are two main applications of WiMAX today: fixed WiMAX and mobile WiMAX. Fixed WiMAX applications are point-to-multipoint, enabling broadband access to homes and businesses, for example. Mobile WiMAX offers the full mobility of cellular networks at broadband speeds.

IEEE 802.16x is an emerging standard organization to define an air interface for fixed and mobile broadband wireless access (BWA) systems. IEEE 802.16x approved "IEEE P802.16-REVd/D5-2004" in May 2004 for fixed BWA systems and published "IEEE P802.16e/D12 Oct. 2005" in October 2005 for mobile BWA systems. Those two standards defined four different physical layers (PHYs) and one media access control (MAC) layer. The OFDM and OFDMA physical layer of the four physical layers are the most popular in the fixed and mobile BWA areas respectively.

FIG. 1 illustrates an example of a wireless communication system 100 in which embodiments of the present disclosure may be employed. The wireless communication system 100 may be a broadband wireless communication system. The wireless communication system 100 may provide communication for a number of cells 102, each of which is serviced by a base station 104. A base station 104 may be a fixed station that communicates with user terminals 106. The base station 104 may alternatively be referred to as an access point, a Node B or some other terminology.

FIG. 1 depicts various user terminals 106 dispersed throughout the system 100. The user terminals 106 may be fixed (i.e., stationary) or mobile. The user terminals 106 may alternatively be referred to as remote stations, access terminals, terminals, subscriber units, mobile stations, stations, user equipment, etc. The user terminals 106 may be wireless devices, such as cellular phones, personal digital assistants (PDAs), handheld devices, wireless modems, laptop computers, personal computers, etc.

A variety of algorithms and methods may be used for transmissions in the wireless communication system 100 between the base stations 104 and the user terminals 106. For example, signals may be sent and received between the base stations 104 and the user terminals 106 in accordance with OFDM/OFDMA techniques. If this is the case, the wireless communication system 100 may be referred to as an OFDM/OFDMA system.

A communication link that facilitates transmission from a base station 104 to a user terminal 106 may be referred to as a downlink 108, and a communication link that facilitates transmission from a user terminal 106 to a base station 104 may be referred to as an uplink 110. Alternatively, a downlink 108 may be referred to as a forward link or a forward channel, and an uplink 110 may be referred to as a reverse link or a reverse channel.

A cell 102 may be divided into multiple sectors 112. A sector 112 is a physical coverage area within a cell 102. Base stations 104 within a wireless communication system 100 may utilize antennas that concentrate the flow of power within a particular sector 112 of the cell 102. Such antennas may be referred to as directional antennas.

Figure 2:
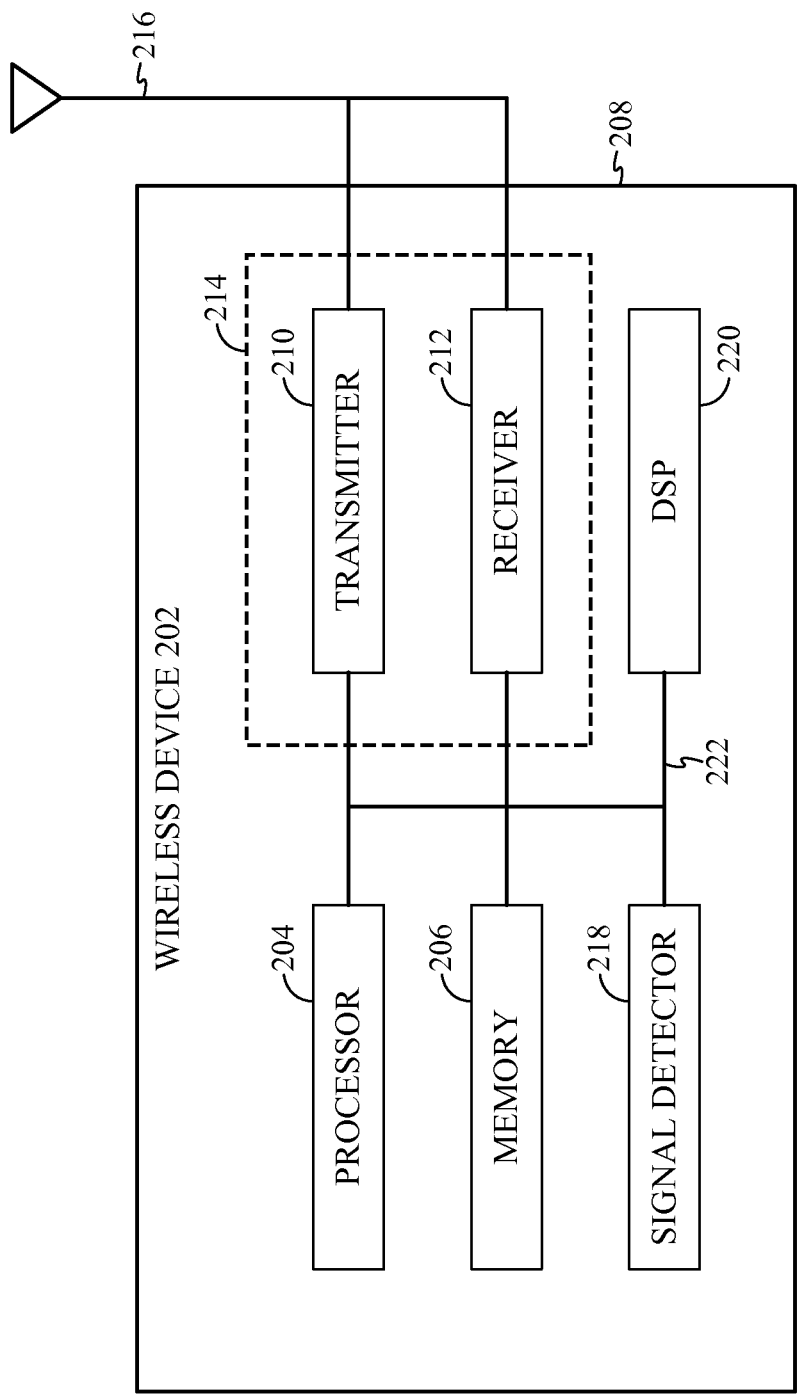
FIG. 2 illustrates various components that may be utilized in a wireless device in accordance with certain embodiments of the present disclosure.

FIG. 2 illustrates various components that may be utilized in a wireless device 202 that may be employed within the wireless communication system 100. The wireless device 202 is an example of a device that may be configured to implement the various methods described herein. The wireless device 202 may be a base station 104 or a user terminal 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, pilot energy per pseudonoise (PN) chips, power spectral density and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

Figure 3:
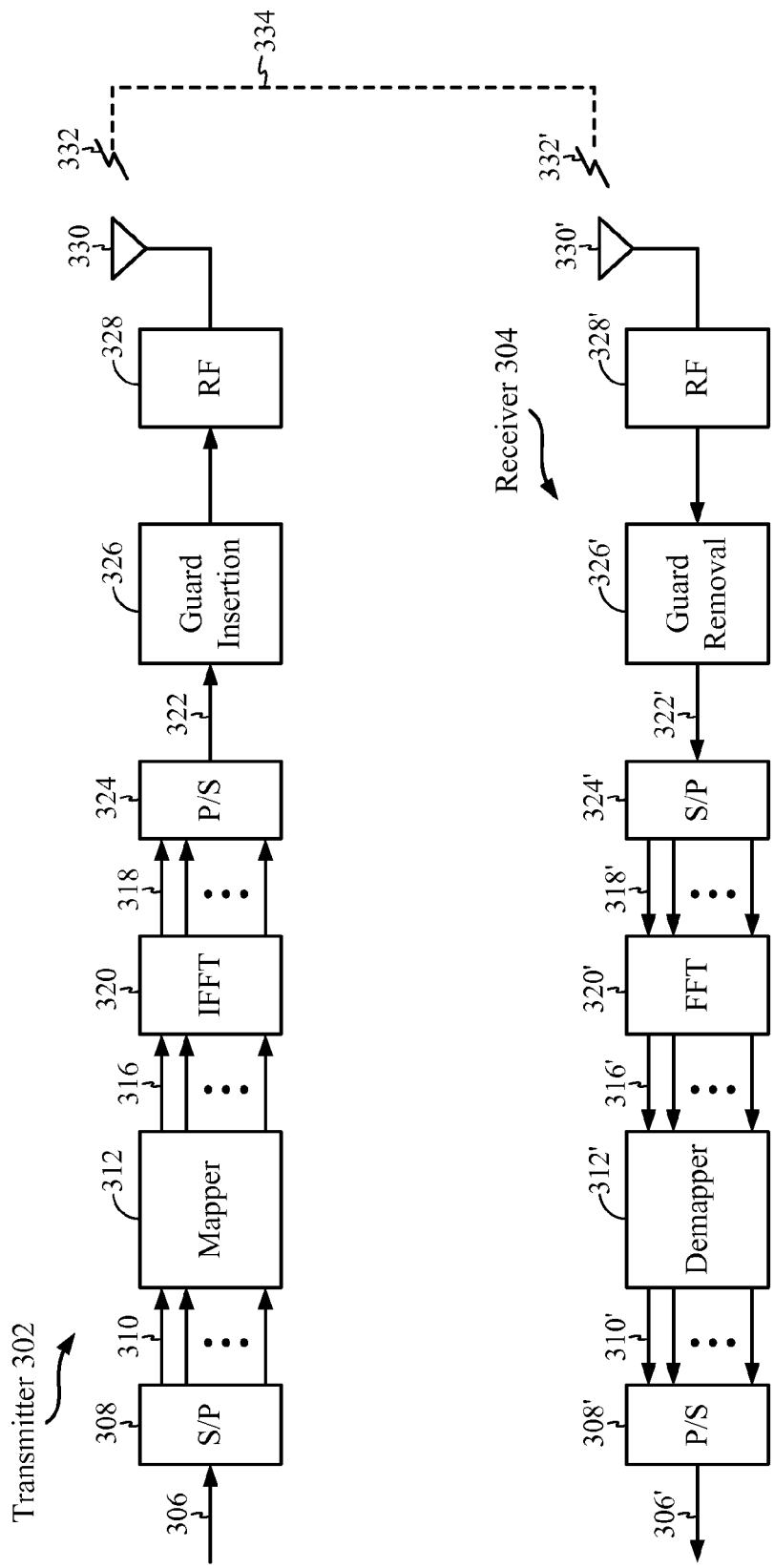
FIG. 3 illustrates an example transmitter and an example receiver that may be used within a wireless communication system that utilizes orthogonal frequency-division multiplexing and orthogonal frequency division multiple access (OFDM/OFDMA) technology in accordance with certain embodiments of the present disclosure.

FIG. 3 illustrates an example of a transmitter 302 that may be used within a wireless communication system 100 that utilizes OFDM/OFDMA. Portions of the transmitter 302 may be implemented in the transmitter 210 of a wireless device 202. The transmitter 302 may be implemented in a base station 104 for transmitting data 306 to a user terminal 106 on a downlink 108. The transmitter 302 may also be implemented in a user terminal 106 for transmitting data 306 to a base station 104 on an uplink 110.

Data 306 to be transmitted is shown being provided as input to a serial-to-parallel (S/P) converter 308. The S/P converter 308 may split the transmission data into N parallel data streams 310.

The N parallel data streams 310 may then be provided as input to a mapper 312. The mapper 312 may map the N parallel data streams 310 onto N constellation points. The mapping may be done using some modulation constellation, such as binary phase-shift keying (BPSK), quadrature phase-shift keying (QPSK), 8 phase-shift keying (8PSK), quadrature amplitude modulation (QAM), etc. Thus, the mapper 312 may output N parallel symbol streams 316, each symbol stream 316 corresponding to one of the N orthogonal subcarriers of the inverse fast Fourier transform (IFFT) 320. These N parallel symbol streams 316 are represented in the frequency domain and may be converted into N parallel time domain sample streams 318 by an IFFT component 320.

A brief note about terminology will now be provided. N parallel modulations in the frequency domain are equal to N modulation symbols in the frequency domain, which are equal to N mapping and N-point IFFT in the frequency domain, which is equal to one (useful) OFDM symbol in the time domain, which is equal to N samples in the time domain. One OFDM symbol in the time domain, $N_s$, is equal to $N_{cp}$ (the number of guard samples per OFDM symbol)+N (the number of useful samples per OFDM symbol).

The N parallel time domain sample streams 318 may be converted into an OFDM/OFDMA symbol stream 322 by a parallel-to-serial (P/S) converter 324. A guard insertion component 326 may insert a guard interval between successive OFDM/OFDMA symbols in the OFDM/OFDMA symbol stream 322. The output of the guard insertion component 326 may then be upconverted to a desired transmit frequency band by a radio frequency (RF) front end 328. An antenna 330 may then transmit the resulting signal 332.

FIG. 3 also illustrates an example of a receiver 304 that may be used within a wireless device 202 that utilizes OFDM/OFDMA. Portions of the receiver 304 may be implemented in the receiver 212 of a wireless device 202. The receiver 304 may be implemented in a user terminal 106 for receiving data 306 from a base station 104 on a downlink 108. The receiver 304 may also be implemented in a base station 104 for receiving data 306 from a user terminal 106 on an uplink 110.

The transmitted signal 332 is shown traveling over a wireless channel 334. When a signal 332' is received by an antenna 330', the received signal 332' may be downconverted to a baseband signal by an RF front end 328'. A guard removal component 326' may then remove the guard interval that was inserted between OFDM/OFDMA symbols by the guard insertion component 326.

The output of the guard removal component 326' may be provided to an S/P converter 324'. The S/P converter 324' may divide the OFDM/OFDMA symbol stream 322' into the N parallel time-domain symbol streams 318', each of which corresponds to one of the N orthogonal subcarriers. A fast Fourier transform (FFT) component 320' may convert the N parallel time-domain symbol streams 318' into the frequency domain and output N parallel frequency-domain symbol streams 316'.

A demapper 312' may perform the inverse of the symbol mapping operation that was performed by the mapper 312 thereby outputting N parallel data streams 310'. A P/S converter 308' may combine the N parallel data streams 310' into a single data stream 306'. Ideally, this data stream 306' corresponds to the data 306 that was provided as input to the transmitter 302. Following the combination of the N parallel data streams 310' into a single data stream 306', the data stream 306' may be decoded into a decoded single data stream 303 by decoder 305 through decoding methods such as turbo decoding.

Early Termination of Turbo Decoding Contingent on Test Criteria

Aspects of the present disclosure provide a method for early termination during decoding (e.g., TDEC) by a receiver subsequent to receiving a transmission signal in communication systems, including UMTS where cyclic redundancy check (CRC) values are not appended to every code block. In other words, even when a TDEC may not be able to check the CRC values for early termination, other criteria may be used to avoid wasteful additional iterations when successful decoding is unlikely.

The techniques presented herein may have advantages relative to conventional methods for determining when to cease futile decoding, or "hard decisions." These techniques include a brute force method of allowing the TDEC to run the full number of iterations for transmissions with high block error rates (BLER). By performing iterations when decoding success is unlikely, these methods have unnecessarily high power consumption consequences.

Aspects of the present disclosure may help solve these problems by basing early termination decisions on criteria, such as long-likelihood ratio values (LLR), such as the minimum LLR amplitude (Min_LLR). According to certain aspects, a hard-decision-aided (HDA) method is proposed where TDEC is terminated when the sequence of hard decision bits of two iterations are identical. The downside of the current HDA method, however, is that the entire sequence of hard decision bits must be stored, which may not be feasible for long code lengths.

Figure 4:
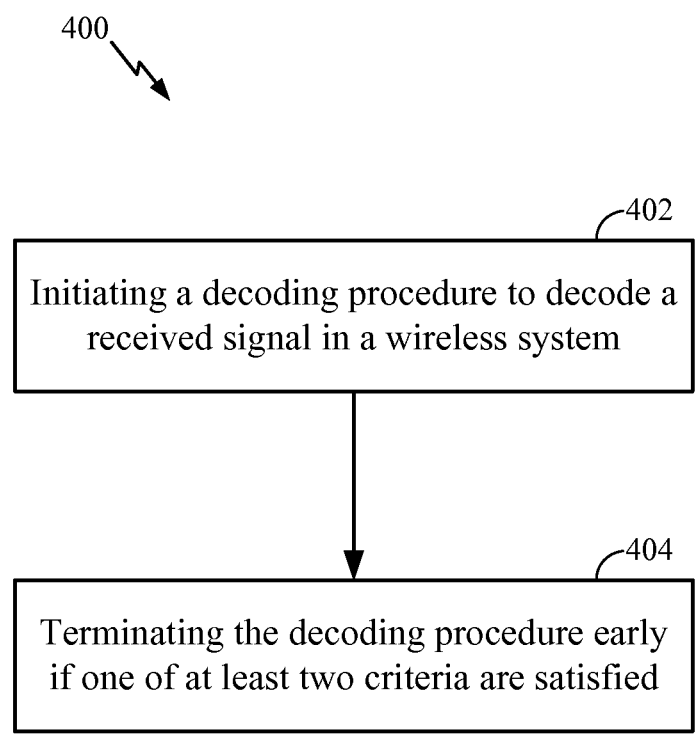
FIG. 4 is a flow diagram illustrating example operations for early termination of turbo decoding, in accordance with certain embodiments of the present disclosure.

FIG. 4 illustrates example operations 400 for early termination of decoding (e.g., TDEC), in accordance with aspects of the present disclosure. The operations 400 may be performed, for example, by a receiver 212 or 304 in UMTS, WCDMA, or TD-CDMA systems. Thus, operations 400 may be referenced by FIG. 2 and FIG. 3.

The operations 400 may begin, at step 402, by initiating a decoding procedure to decode a received signal in a wireless system. At step 404, the decoding procedure may terminate early if one of at least two criteria is satisfied. Various examples of the types of criteria will be described below, in greater detail.

Figures 5, 6:
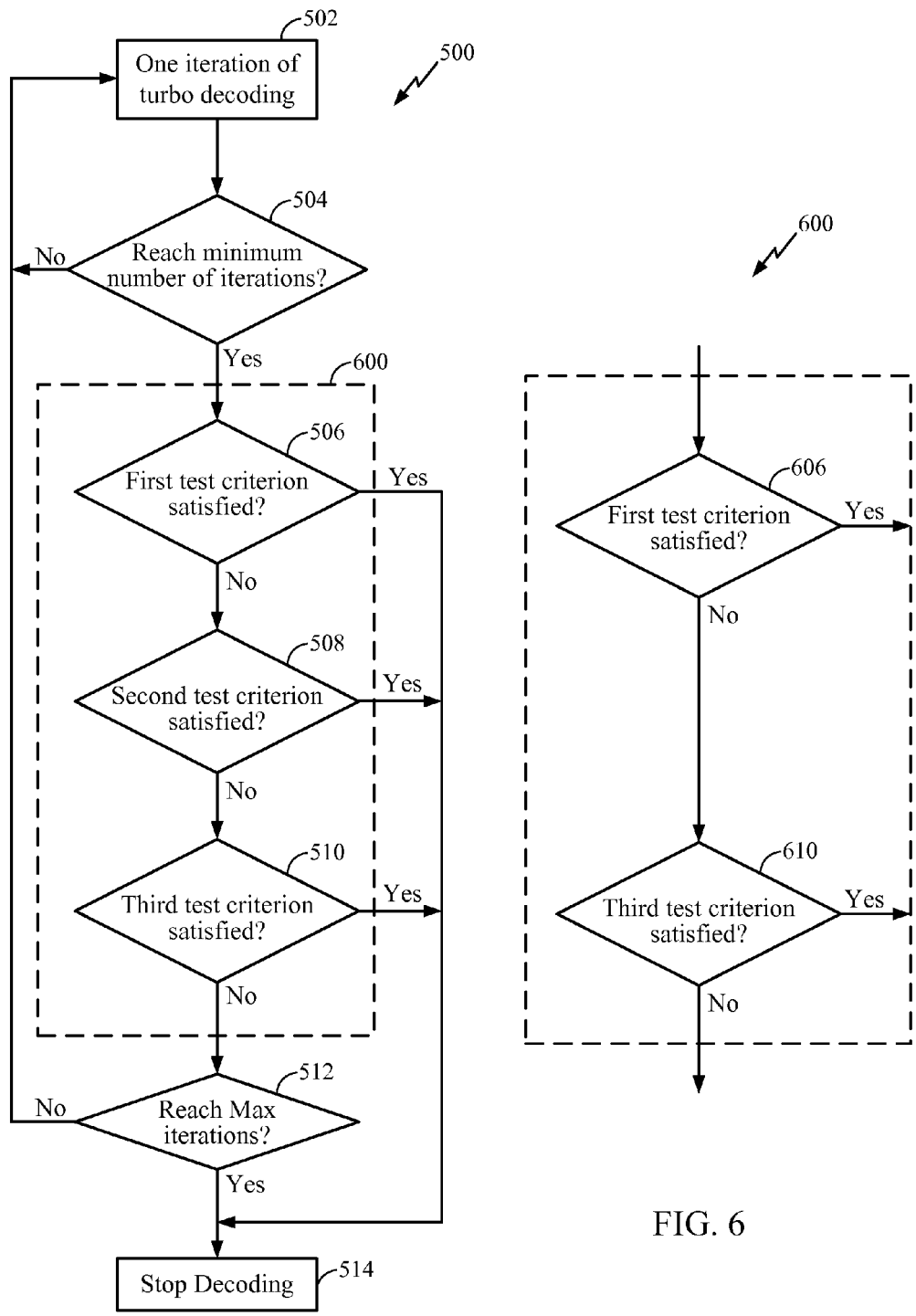
FIG. 5 is a flow diagram illustrating example operations for early termination of turbo decoding when three test criteria are implemented, in accordance with certain embodiments of the present disclosure.
FIG. 6 is a flow diagram illustrating example operations for early termination of turbo decoding by disabling one of at least three test criteria, in accordance with certain embodiments of the present disclosure.

FIG. 5 is a flow diagram of example operations 500 for early termination of TDEC. The operations 500 may correspond, for example, to the application of multiple test criteria as mentioned at 404 in FIG. 4.

The operations 500 may begin, at 502, by executing an iteration of TDEC. At step 504, the decoder may determine whether the minimum number of iterations is met. If the minimum number of iterations is not met, the decoder may return to step 502 and execute another iteration of TDEC. However, if the minimum number of iterations is met, at step 506, the decoder may execute a first test criterion.

If the first test criterion is satisfied, then the decoder may terminate TDEC. However, if the first test criterion is not satisfied, the decoder may execute a second test criterion at step 508. If the second test criterion is satisfied, then the decoder may terminate TDEC. However, if the second test criterion is not satisfied, the decoder may execute a third test criterion at step 510.

If the third test criterion is satisfied, then the decoder may terminate TDEC. However, if the third test criterion is not satisfied, at step 512, the decoder may determine whether the maximum number of iterations has been executed. At step 514, the decoder may terminate TDEC if the maximum number of iterations is met. If the maximum number of iterations is not met, however, then the decoder may return to step 502 and execute another iteration of TDEC.

It should be noted that the number of test criteria in the present embodiment is only one form of a set of at least two test criteria in accordance with certain embodiments of the present disclosure. More or less criteria may be utilized within the scope of the present disclosure.

In another embodiment, one of the test criterion (described with reference to FIG. 5) may be disabled (e.g., if not needed or desired) leaving at least two test criteria in the early termination scheme for TDEC.

FIG. 6 illustrates a flow diagram segment of example operations 600 when one test criterion is disabled from example operations 500 in FIG. 5. Example operations 600 may begin, for example, after running a minimum number of iterations. At step 606, the decoder may execute a first test criterion. If the first test criterion is satisfied, then the decoder may terminate TDEC at step 514 (as in FIG. 5). However, if the first test criterion is not satisfied, the decoder may execute a third test criterion 610, skipping the second test criterion of step 508.

At least three test criteria may be implemented before one test criterion may be disabled. Furthermore, any number of test criteria may be disabled in accordance with the present disclosure, as long as at least two test criteria are utilized. It should be noted that even though this embodiment discloses disabling the second out of three test criteria, other embodiments that may disable any other test criteria are still within the scope of the present disclosure.

Test Criteria for Early Termination of Turbo Decoding

In one embodiment, the first, second, and third test criteria may include the Minimum LLR threshold test, the Virtual Cyclic Redundancy Check (CRC) test, and the Maximum LLR condition test, respectively.

Figure 7:
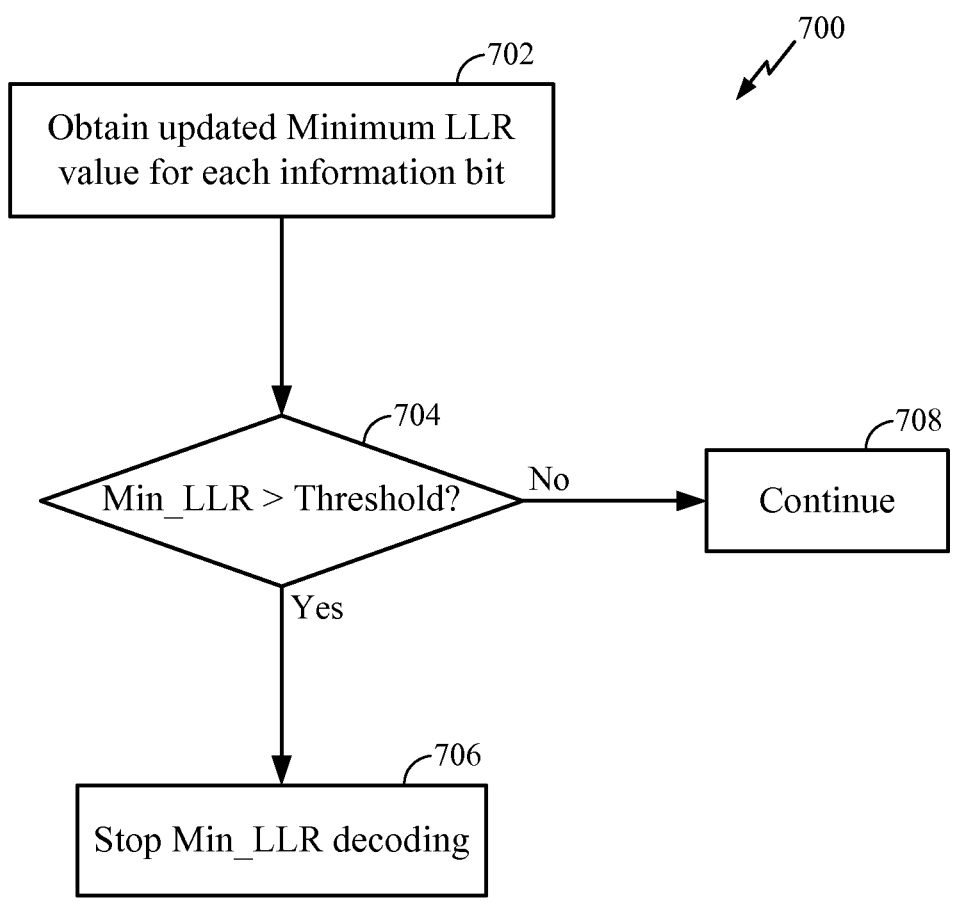
FIG. 7 is a flow diagram illustrating example operations for the minimum LLR test criterion that may be utilized as one test criterion for early termination of turbo decoding, in accordance with certain embodiments of the present disclosure.

FIG. 7 is a flow diagram of example operations 700 for the Minimum LLR threshold test criterion. The operations 700 may be performed at any one of the test criterion steps 506, 508, or 510 in example operations 500 in FIG. 5. In each iteration of TDEC, step 502, a LLR is generated for hard decision.

At step 702, the Min_LLR may be obtained from the iteration of TDEC. The magnitude of an LLR value reflects the reliability of the hard decision where hard decision bits with smaller LLR magnitudes may correspond to hard decisions more likely in error. At step 704, the Min_LLR may be compared to a threshold value. At step 706, if the Min_LLR is greater than a certain threshold value, the TDEC process may terminate. However, at step 708, if the Min_LLR is not greater than a certain threshold value, the decoder may continue to the next test criterion or continue to step 512 where the decoder may determine whether the maximum number of iterations has been met.

Figure 8:
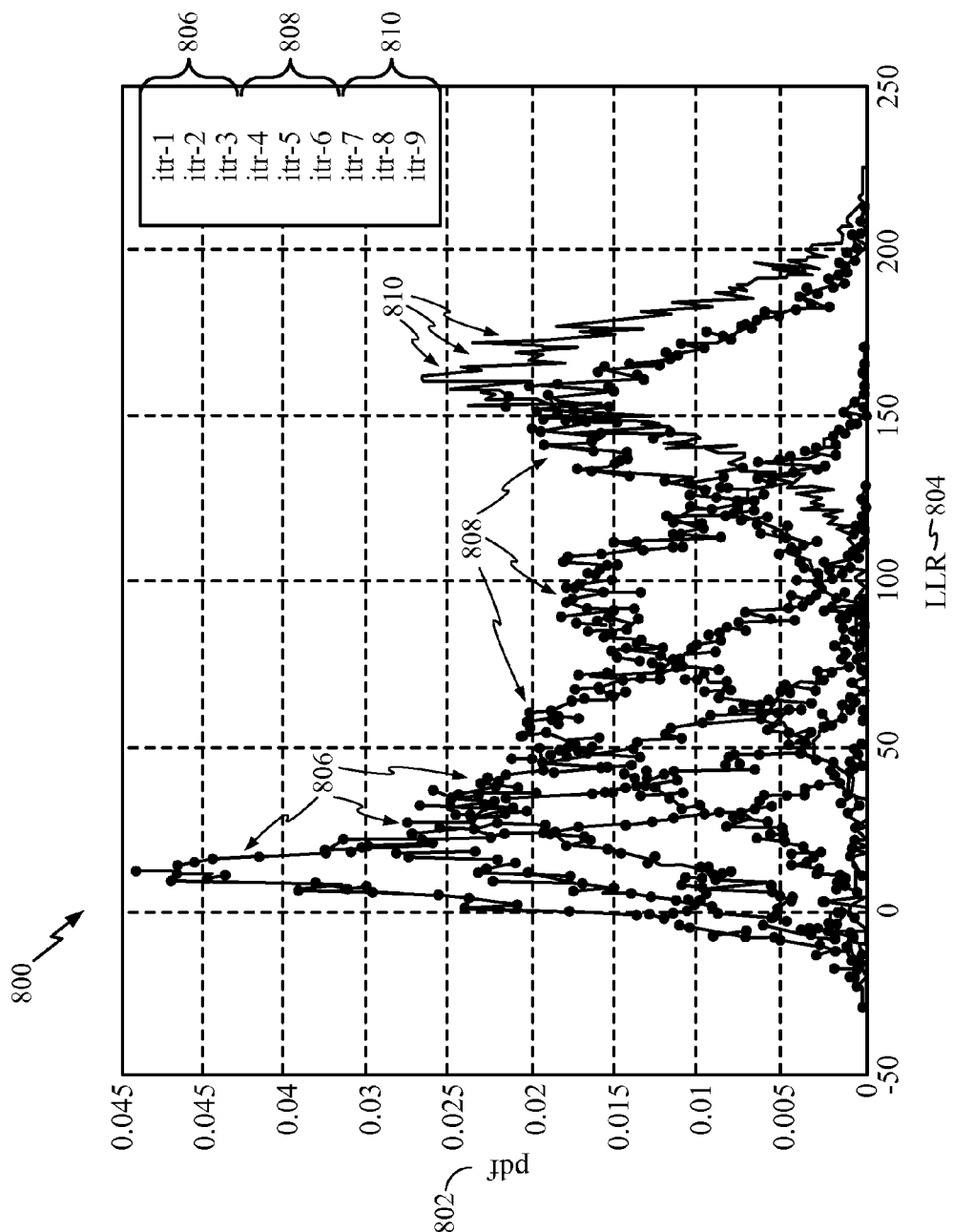
FIG. 8 is an example test result of example operations for the minimum LLR test criterion, in accordance with certain embodiments of the present disclosure.

An example test result from operations 700 may be illustrated by the example output graph 800 of FIG. 8. The y-axis 802 represents the probability distribution function (pdf) of each bit in one TDEC iteration and the x-axis 804 represents the magnitude of the LLR value of each bit in one TDEC iteration. The LLR values for each bit of a TDEC iteration have a Gaussian-like distribution with the Min_LLR at the farthest left of the Gaussian distribution. The Gaussian distributions of the first three iterations 806 may be shown with a minimum LLR magnitude closer to an LLR of 0, representing a less reliable hard decision. As more TDEC iterations are executed, the next three Gaussian distributions representing the next three TDEC iterations 808 may be shifted more to the right. The shift to the right may represent a greater likelihood that the decoding is correct. Finally, the last three Gaussian distributions representing the last three TDEC iterations 810 may be shown at the farthest right side of the graph, thereby representing the high likelihood that the decoding is correct.

Figure 9:
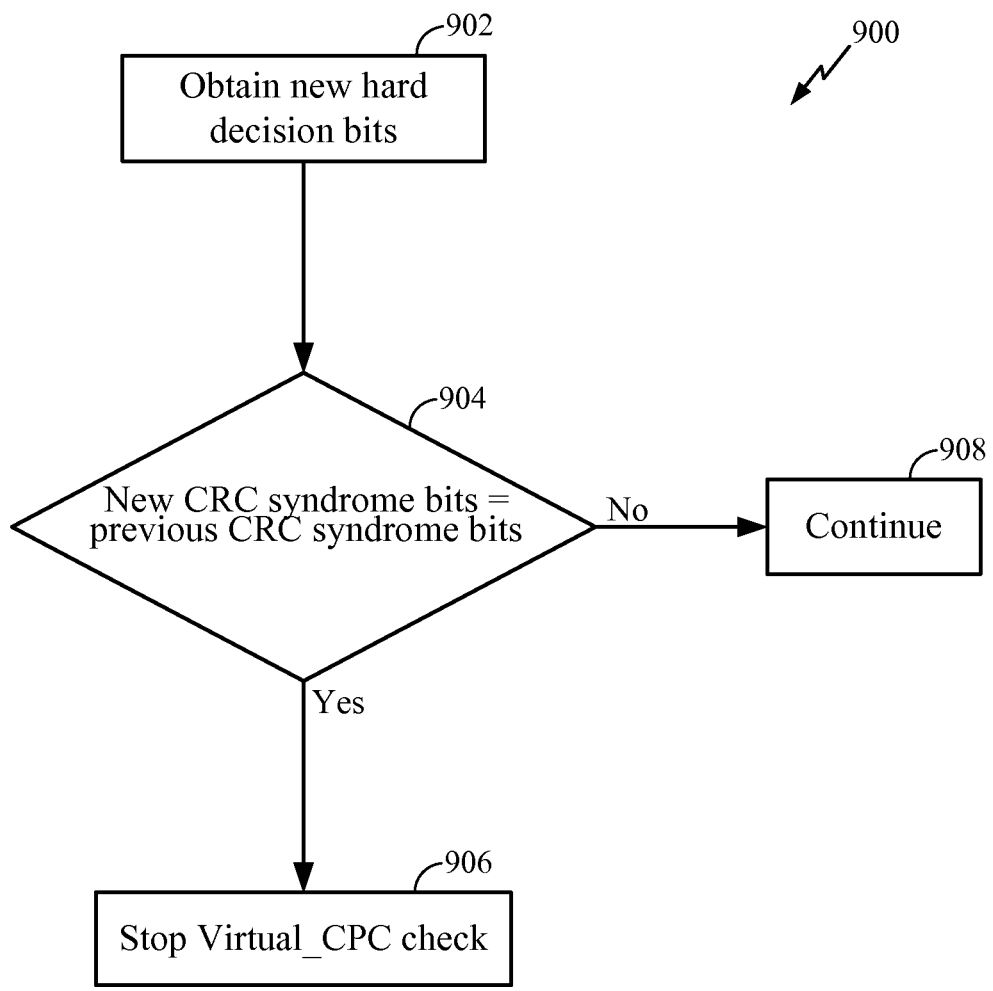
FIG. 9 is a flow diagram illustrating example operations for the Virtual CRC test criterion that may be utilized as one test criterion for early termination of turbo decoding, in accordance with certain embodiments of the present disclosure.

FIG. 9 is a flow diagram of example operations 900 for the Virtual CRC test criterion. The operations 900 may be performed at any one of the test criterion steps 506, 508, or 510 in example operations 500 in FIG. 5.

The operations 900 may begin with step 902 where new hard decision bits are obtained from one TDEC iteration. A sequence of hard decision bits may be fed into a CRC circuit even though there are no CRC bits appended at the end of the code word. At step 904, the new CRC syndrome from the TDEC iteration may be compared to the CRC syndromes from the previous TDEC iterations. It may be very likely that if the CRC syndromes of two or more consecutive iterations are identical, then the hard decision bits of those two or more iterations may be identical as well. At step 906, if the new hard decision bits are identical to the previous hard decision bits, the TDEC process may terminate. However, at step 908, if the two TDEC values are not identical, the decoder may continue to the next test criterion or continue to step 512 where the decoder may determine whether the maximum number of iterations has been met.

Figure 10:
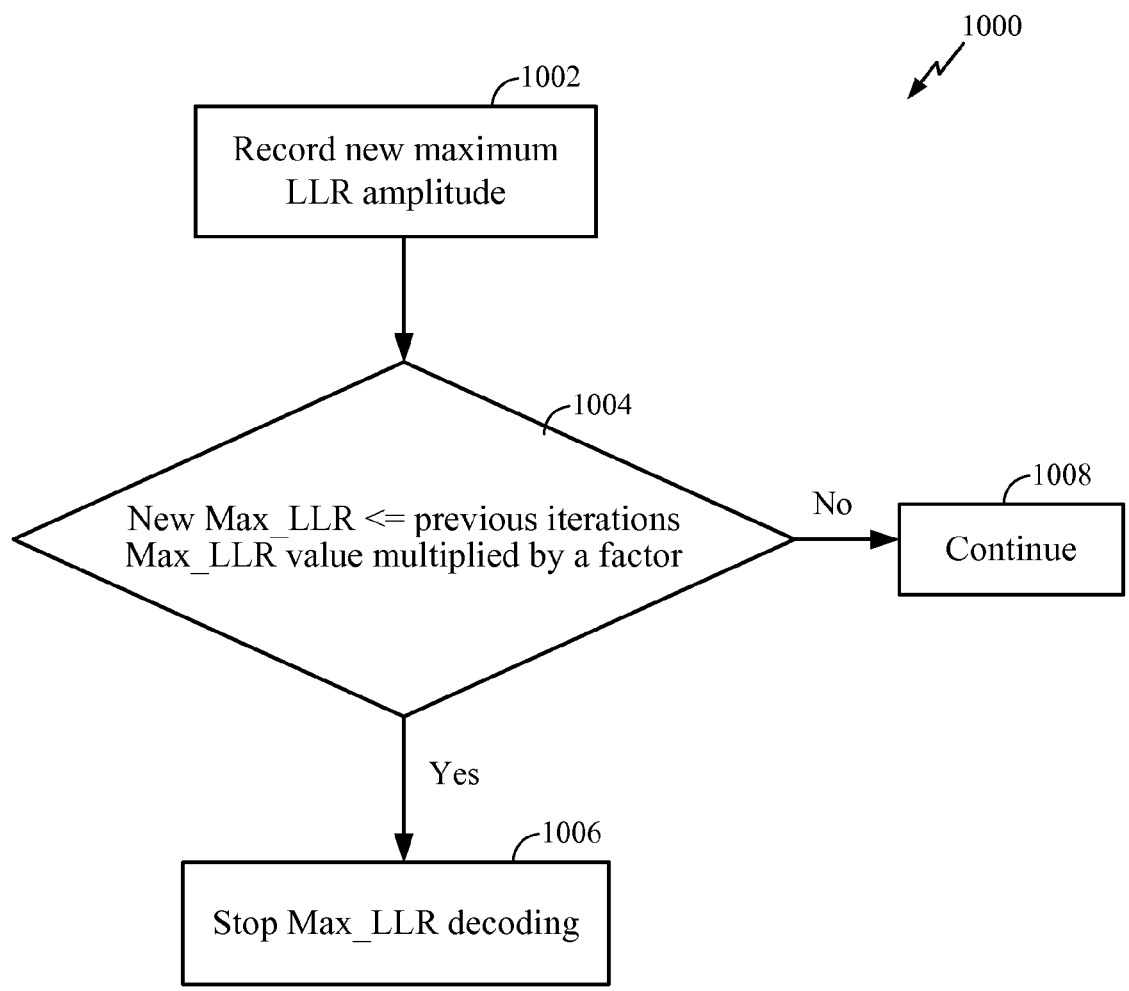
FIG. 10 is a flow diagram illustrating example operations for the maximum LLR test criterion that may be utilized as one test criterion for early termination of turbo decoding, in accordance with certain embodiments of the present disclosure.

FIG. 10 is a flow diagram of example operations 1000 for the Maximum LLR trend test. The operations 1000 may be performed at any one of the test criterion steps 506, 508, or 510 in example operations 500 in FIG. 5. The maximum LLR criterion may be particularly useful in cases where the block error rate (BLER) is expected to be high.

Figure 11:
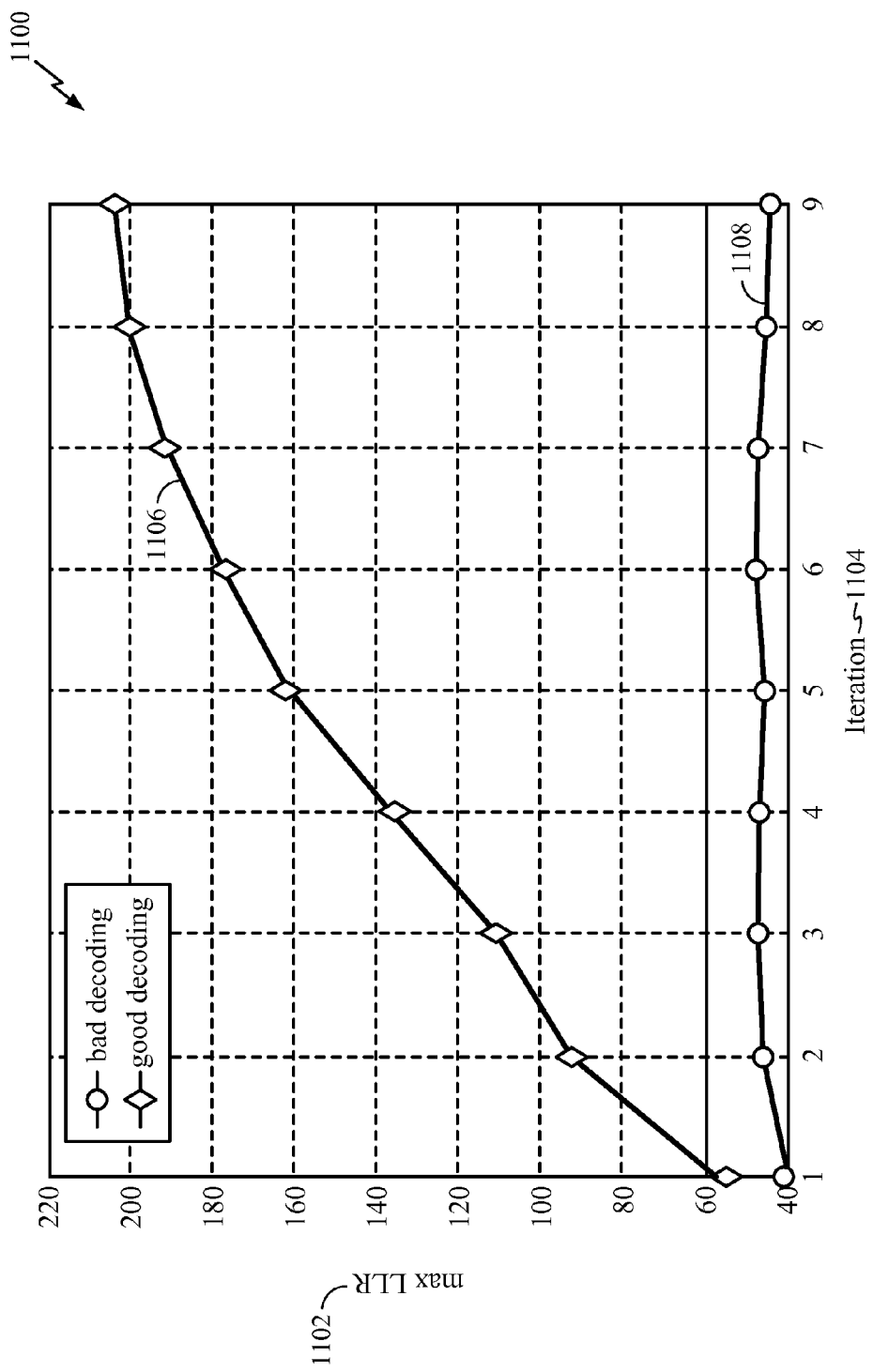
FIG. 11 is an example test result of example operations for the maximum LLR test criterion, in accordance with certain embodiments of the present disclosure.

The operations 1000 may begin with step 1002 where the new maximum LLR value (Max_LLR) from one TDEC iteration is recorded. At step 1004, the new Max_LLR may be compared to the previous TDEC iteration's Max_LLR. A constantly increasing Max_LLR with respect to subsequent TDEC iterations is expected for an improvement in decoding accuracy. Therefore, at step 1006, if the new TDEC iteration's Max_LLR is less than or equal to the a nominal amount of the previous TDEC iteration's Max_LLR, the TDEC process may terminate. However, at step 1008, if the Max_LLR of the new TDEC iteration is greater than the Max_LLR of the previous TDEC iteration by more than a nominal amount, the decoder may continue to the next test criterion or continue to step 512 where the decoder may determine whether the maximum number of iterations has been met. The user may define the threshold value of a nominal increase in Max_LLR according to desired decoding accuracy (for example, by multiplying the previous iteration's Max_LLR value by a factor, as shown at 1004). In this example embodiment, an increase of less than or equal to five units is considered nominal An example test result from operations 1000 may be illustrated by the example output graph 1100 of FIG. 11. The y-axis 1102 represents the maximum LLR value of one TDEC iteration and the x-axis 1104 represents the respective TDEC iteration. A good decoding may be illustrated by line 1106 that constantly increases in maximum LLR value with each subsequent TDEC iteration. A bad decoding may be illustrated by line 1108 that decreases, stays the same, or nominally increases in maximum LLR value with each subsequent TDEC iteration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated in the Figures, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to embodiments of the present disclosure, other and further embodiments of the disclosure may be devised without departing from the basic scope thereof, and the scope thereof is determined by the claims that follow.

What is claimed is:

1. A method for wireless communications, comprising:
    initiating a decoding procedure to decode a received signal in a wireless system;
    evaluating a first criterion;
    terminating the decoding procedure early if the first criterion is satisfied;
    evaluating a second criterion if the first criterion is not satisfied;
    terminating the decoding procedure early if the second criterion is satisfied;
    evaluating a third criterion if the second criterion is not satisfied; and
    terminating the decoding procedure early if the third criterion is satisfied.

2. The method of claim 1, wherein the decoding of the received signal is with turbo decoding (TDEC).

3. The method of claim 1, wherein the wireless system includes at least one of Universal Mobile Telecommunications System (UMTS), Wideband Code Division Multiple Access (WCDMA), and Time Division Code Division Multiple Access (TD-CDMA).

4. The method of claim 1, wherein:
    the first criterion is satisfied when a minimum LLR amplitude (Min_LLR) has reached a threshold value;
    the second criterion is satisfied when virtual cyclic redundancy check (CRC) values of two or more iterations are identical; and
    the third criterion is satisfied when a maximum LLR amplitude (Max_LLR) is less than or equal to the previous iteration's Max_LLR value.

5. The method of claim 1, further comprising:
    disabling the first, second, or third criterion if the respective criterion is not at least one of needed or desired.

6. An apparatus for wireless communications, comprising:
    means for initiating a decoding procedure to decode a received signal in a wireless system;
    means for evaluating a first criterion;
    means for terminating the decoding procedure early if the first criterion is satisfied;
    means for evaluating a second criterion if the first criterion is not satisfied;
    means for terminating the decoding procedure early if the second criterion is satisfied;
    means for evaluating a third criterion if the second criterion is not satisfied; and
    means for terminating the decoding procedure early if the third criterion is satisfied.

7. The apparatus of claim 6, wherein the means for decoding of the received a signal utilizes turbo decoding (TDEC).

8. The apparatus of claim 6, wherein the wireless system includes at least one of Universal Mobile Telecommunications System (UMTS), Wideband Code Division Multiple Access (WCDMA), and Time Division Code Division Multiple Access (TD-CDMA).

9. The apparatus of claim 6, wherein:
    the first criterion is satisfied when a minimum LLR amplitude (Min_LLR) has reached a threshold value;
    the second criterion is satisfied when virtual cyclic redundancy check (CRC) values of two or more iterations are identical; and the third criterion is satisfied when a maximum LLR amplitude (Max_LLR) is less than, equal to, or nominally greater than the previous iteration's Max_LLR value.

10. The apparatus of claim 6, further comprising:
means for disabling the first, second, or third criterion if the respective criterion is not at least one of needed or desired.

11. An apparatus for wireless communications, comprising:
at least one processor configured to initiate a decoding procedure to decode a received signal in a wireless system, evaluate a first criterion, terminate the decoding procedure early if the first criterion is satisfied, evaluate a second criterion if the first criterion is not satisfied, terminate the decoding procedure early if the second criterion is satisfied, evaluate a third criterion if the second criterion is not satisfied, and terminate the decoding procedure early if the third criterion is satisfied; and
a memory coupled with the at least one processor.

12. The apparatus of claim 11, wherein the at least one processor is configured to decode the received a signal utilizing turbo decoding (TDEC).

13. The apparatus of claim 11, wherein the wireless system includes at least one of Universal Mobile Telecommunications System (UMTS), Wideband Code Division Multiple Access (WCDMA), and Time Division Code Division Multiple Access (TD-CDMA).

14. The apparatus of claim 11, wherein:
the first criterion is satisfied when a minimum LLR amplitude (Min_LLR) has reached a threshold value;
the second criterion is satisfied when virtual CRC values of two or more iterations are identical; and
the third criterion is satisfied when a maximum LLR amplitude (Max_LLR) is less than or equal to the previous iteration's Max_LLR value.

15. The apparatus of claim 11, wherein the at least one processor is configured to:
disable the first, second, or third criterion if the respective criterion is not at least one of needed or desired.

16. A non-transitory computer-readable medium having instructions stored thereon, the instructions executable by one or more processors for:
initiating a decoding procedure to decode a received signal in a wireless system;
evaluating a first criterion;
terminating the decoding procedure early if the first criterion is satisfied;
evaluating a second criterion if the first criterion is not satisfied;
terminating the decoding procedure early if the second criterion is satisfied;
evaluating a third criterion if the second criterion is not satisfied; and
terminating the decoding procedure early if the third criterion is satisfied.

17. The non-transitory computer-readable medium of claim 16, wherein the decoding of the received a signal is with turbo decoding (TDEC).

18. The non-transitory computer-readable medium of claim 16, wherein the wireless system includes at least one of Universal Mobile Telecommunications System (UMTS), Wideband Code Division Multiple Access (WCDMA), and Time Division Code Division Multiple Access (TD-CDMA).

19. The non-transitory computer-readable medium of claim 16, wherein:
the first criterion is satisfied when a minimum LLR amplitude (Min_LLR) has reached a threshold value;
the second criterion is satisfied when virtual cyclic redundancy check (CRC) values of two or more iterations are identical; and
the third criterion is satisfied when a maximum LLR amplitude (Max_LLR) is less than or equal to the previous iteration's Max_LLR value.

20. The non-transitory computer-readable medium of claim 16, further comprising:
disabling the first, second, or third criterion if the respective criterion is not at least one of needed or desired.

* * * * *